United States Patent
Pangrle et al.

(10) Patent No.: US 6,713,382 B1
(45) Date of Patent: Mar. 30, 2004

(54) VAPOR TREATMENT FOR REPAIRING DAMAGE OF LOW-K DIELECTRIC

(75) Inventors: Suzette K. Pangrle, Cupertino, CA (US); Ecran Adem, Sunnyvale, CA (US); Calvin Gabriel, Cupertino, CA (US); Lynne A. Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 50 days.

(21) Appl. No.: 10/059,268

(22) Filed: Jan. 31, 2002

Related U.S. Application Data

(60) Provisional application No. 60/265,082, filed on Jan. 31, 2001.

(51) Int. Cl.[7] .......................................... H01L 21/4763
(52) U.S. Cl. ..................... 438/622; 438/623; 438/624; 438/627; 438/637; 438/648; 438/653; 438/687; 438/723; 438/725; 438/738
(58) Field of Search .................. 438/622–624, 438/627, 634, 637, 643, 653, 677, 687, 710, 714, 638, 648, 656, 723–725, 734, 737–738, 743–744

(56) References Cited

U.S. PATENT DOCUMENTS

| | | | | |
|---|---|---|---|---|
| 5,866,945 A | * | 2/1999 | Chen et al. | 257/750 |
| 5,968,377 A | * | 10/1999 | Yuasa et al. | 219/121.41 |
| 6,060,384 A | * | 5/2000 | Chen et al. | 438/710 |
| 6,255,732 B1 | * | 7/2001 | Yokoyama et al. | 257/760 |
| 6,492,257 B1 | * | 12/2002 | Shields et al. | 438/637 |
| 6,495,447 B1 | * | 12/2002 | Okada et al. | 438/627 |
| 2001/0036740 A1 | * | 11/2001 | Shields et al. | 438/710 |
| 2003/0008516 A1 | * | 1/2003 | Chang et al. | 438/704 |

FOREIGN PATENT DOCUMENTS

JP   2000340549   * 12/2000

* cited by examiner

*Primary Examiner*—Lynne Gurley

(57) ABSTRACT

A method of manufacturing a semiconductor device includes forming a first level, forming a first barrier layer over the first level, forming a dielectric layer over the first barrier layer, forming an opening having side surfaces through the dielectric layer, etching the first barrier layer, and filling the opening with metal to form a first metal feature. The process also includes the step of replacing hydroxyl terminated ions on the side surfaces. This step of replacing the hydroxyl terminated ions can occur after the opening is formed or after the first barrier layer is etched. A semiconductor device produced by the method of manufacturing is also disclosed.

10 Claims, 8 Drawing Sheets

VAPOR TREATMENT FOR REPAIRING DAMAGE OF LOW-K DIELECTRIC

RELATED APPLICATIONS

This application claims priority from U.S. Provisional Patent Application Serial No. 60/265,082, Filed Jan. 31, 2001.

FIELD OF THE INVENTION

The present invention relates to the manufacturing of semiconductor devices, and more particularly, to low-k interlevel and intermetal dielectrics in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene" -type processing. Generally, this process involves forming a via opening in the inter-metal dielectric layer or interlayer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W),. Cu and its alloys can be readily deposited at low temperatures formed by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. Finally, while electroplating requires a continuous nucleation/seed layer, very thin and discontinuous islands of a catalytic metal may be employed with electroless plating.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

In response to the problem of capacitance between adjacent conductive elements caused by use of silicon oxide dielectrics, other dielectric materials, commonly known as low-k dielectrics, have been used. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5. Still another example of a low-k dielectric material is carbon doped silicon oxide wherein at least a portion of the oxygen atoms bonded to the silicon atoms are replaced by one or more organic groups such as, for example, an alkyl group such as a methyl ($CH_3$—) group.

A problem associated with the use of many low-k dielectric materials is that resist material can diffuse into the low-k dielectric material, and the low-k material can be damaged by exposure to oxidizing or "ashing" systems, which remove a resist mask used to form openings, such as vias, in the low-k dielectric material. These processes can damage the low-k dielectric material by causing the formation of hydroxyl (OH) terminated molecules at exposed surfaces of the low-k dielectric material. Hydroxyl ions are polar, and these polar ions tend to attract water, which is a bipolar molecule. Thus, the damaged surface of the low-k dielectric material becomes hygroscopic. Subsequent processing, such as annealing, can result in water vapor formation, and absorption of water by the low-k dielectric material can cause an undesirable increase in the dielectric constant of the low-k dielectric material. For this reason in particular, the upper surface of the low-k dielectric material is typically protected by a capping layer, such as silicon oxide, disposed over the upper surface.

A number of different variations of a damascene process using low-k dielectrics have been employed during semiconductor manufacturing. With reference to FIGS. 1A–1G, an example of a damascene process for forming vias between vertically spaced metallization levels, according to conventional techniques, will be described. This process can be repeated to form multiple metallization levels, i.e., two or more, stacked one on top of another.

In FIG. 1A, a first barrier layer 12 is deposited over a first metallization level 10. The first barrier layer 12 acts as a passivation layer that protects the first metallization level 10 from oxidation and contamination and prevents the material of the metallization level 10 from diffusing into a subsequently formed dielectric layer. The first barrier layer 12 also acts as an etch stop during subsequent etching of the dielectric layer. A typical material used as an etch stop is silicon nitride, and approximately 500 angstroms of silicon nitride is typically deposited over the metallization level 10 to form the first barrier layer 12. An illustrative process used for depositing silicon nitride is plasma enhanced CVD (PECVD).

In FIG. 1B, a first low-k dielectric layer 14 is deposited over the first barrier layer 12. The majority of low-k dielectric materials used for a dielectric layer are based on organic or inorganic polymers. The liquid dielectric material is typically spun onto the surface under ambient conditions to a desired depth. This is typically followed by a heat treatment to evaporate solvents present within the liquid dielectric material and to cure the film to form the first low-k dielectric layer 14.

After formation of the first low-k dielectric layer 14, a capping layer 13 is typically formed over the first low-k dielectric layer 14. The function of the capping layer 13 is to protect the first low-k dielectric layer 14 from the process that removes a subsequently formed resist layer. The capping layer 13 is also used as a mechanical polishing stop to prevent damage to the first low-k dielectric layer 14 during subsequent polishing away of conductive material that is deposited over the first low-k dielectric layer 14 and in a subsequently formed via. Examples of materials used as a capping layer 13 include silicon oxide and silicon nitride.

In FIG. 1C, vias 16 are formed in the first low-k dielectric layer 14 using conventional lithographic and etch techniques. The lithographic process involves depositing a resist 17 over the capping layer 13 and exposing and developing the resist 17 to form the desired patterns of the vias 16. The first etch, which is highly selective to the material of the first low-k dielectric layer 14 and the capping layer 13, removes the capping layer 13 and the first low-k dielectric layer 14 until the etchant reaches the first barrier layer 12. The first etch is typically an anisotropic etch, such as a reactive ion plasma dry etch, that removes only the exposed portions of the first low-k dielectric layer 14 directly below the opening in the resist 17. By using an anisotropic etch, the via 16 can be formed with substantially perpendicular sidewalls.

In FIG. 1D, the resist 17 is removed from over the first dielectric layer 14. A typical method of removing the resist 17 is known as "ashing" whereby the resist 17 is oxidized with an $O_2$ plasma at elevated temperatures. After the resist 17 is removed, a second etch, which is highly selective to the material of the first barrier layer 12, removes the first barrier layer 12 until the etchant reaches the first metallization level 10. The second etch is also typically an anisotropic etch.

In FIG. 1E, an adhesion/barrier material, such as tantalum, titanium, tungsten, tantalum nitride, or titanium nitride, is deposited. The combination of the adhesion and barrier material is collectively referred to as a second barrier layer 20. The second barrier layer 20 acts to prevent diffusion into the first low-k dielectric layer 14 of the conductive material subsequently deposited into the via 16.

In FIG. 1F, a layer 22 of a conductive material, for example, a Cu or Cu-based alloy, is deposited into the via 16 and over the dielectric layer 14. A typical process initially involves depositing a "seed" layer on the second barrier layer 20 subsequently followed by conventional plating techniques, e.g., electroless or electroplating techniques, to fill the via 16. So as to ensure complete filling of the via 16, the Cu-containing conductive layer 22 is deposited as a blanket (or "overburden") layer 24 so as to overfill the via 16 and cover the upper surface 26 of the capping layer 13.

In FIG. 1G, the entire excess thickness of the metal overburden layer 24 over the upper surface 26 of the capping layer 13 is removed using a CMP process. A typical CMP process utilizes an alumina ($Al_2O_3$)-based slurry and leaves a conductive plug in the via 16. The conductive plug has an exposed upper surface 30, which is substantially co-planar with the surface 26 of the capping layer 13.

Although the upper surface of the low-k dielectric material can be protected from subsequent processes using a capping layer, the side edges that define the via within the low-k dielectric material are not protected. In particular, these side edges can be damaged during the etching and ashing processes. These processes can lead to the formation of hydroxyl (OH) terminated molecules at the surfaces of the via, and these polar hydroxyl terminated ions tend to attract water, a bipolar molecule. As such, the damage to the low-k dielectric material causes the surface of the via to be hygroscopic, and absorption of water formed during subsequent processing can cause the dielectric constant of the low-k dielectric material to be undesirably increased. Accordingly, a need exists for a method of repairing the damage caused by processes such as etching and ashing.

SUMMARY OF THE INVENTION

This and other needs are met by embodiments of the present invention which provide a method of manufacturing a semiconductor device. The method includes forming a first level, forming a first barrier layer over the first level, forming a dielectric layer over the first barrier layer, forming an opening having side surfaces through the dielectric layer, etching the first barrier layer, and filling the opening with metal to form a first metal feature. The process also includes the step of replacing hydroxyl terminated ions on the side surfaces. This step of replacing the hydroxyl terminated ions can occur after the opening is formed or after the first barrier layer is etched. Furthermore, the hydroxyl terminated ions can be replaced using by plasma etching, and the plasma can be performed using a species selected from the group consisting of $CH_3OH$, $C_2H_5OH$, $CH_4$, and $C_2H_6$.

By replacing the hydroxyl terminated ions, the side surfaces have decreased hydrophilic propensity (i.e., the propensity to absorb water) and will therefore be less likely to absorb moisture during subsequent processes. Importantly, by reducing the amount of moisture absorbed during subsequent processing, there is a reduction in the undesirable increase in dielectric value of the low-k dielectric caused by the subsequent processing.

In an aspect of the invention, the dielectric layer has a dielectric constant less than about 3.5. Also, the metal and the first level can comprise copper (Cu) or a Cu alloy. Furthermore, the opening can be a via opening, a trench, or a dual damascene opening comprising a lower via opening in communication with an upper trench; and the first metal feature can comprises a via, a line, or a combination of a lower via in contact with an upper line, respectively.

In a further embodiment of the present invention, a method of treating a dielectric layer comprises the steps of etching a feature having surfaces into a dielectric layer and treating the feature surfaces to replace hydroxyl terminated ions on the side surfaces with a species that reduces hygroscopy of the feature surfaces. Additionally, the hydroxyl terminated ions can be replaced using plasma etching.

In an additional embodiment of the present invention, a semiconductor device comprises a first level, a first barrier layer, a dielectric layer, an opening having side surfaces in the dielectric layer, and metal within the opening. The first barrier layer is disposed over the first level, and the dielectric layer is disposed over the first barrier layer. The opening extends through the first dielectric layer and the first barrier layer to the first level. Furthermore, the side surfaces are terminated with ions selected from the group consisting of $OCH_3$, $OC_2H_5$, $OCH_3$, and $OCH_2CH_3$.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of the dielectric constant of a low-k dielectric layer being increased as a result of damage caused by ashing and etching, which cause the breakdown of bonds in the low-k dielectric material and results in the formation of hydroxyl (OH) terminated bonds on exposed surfaces of the low-k dielectric material. This is achieved, in part, by a repair process subsequent to the etching and/or ashing processes in which the hydroxyl terminated bonds are replaced with another species of ion. Advantageously, by replacing the hydroxyl ion with another species, the exposed surfaces of the low-k dielectric material will become less hygroscopic and therefore tend to absorb less moisture. Importantly, by absorbing less moisture during subsequent processesing, the undesirable increase of the dielectric constant of the low-k dielectric material as a result of the subsequent processesing can be decreased.

Furthermore, the present invention addresses problems associated with the high capacitance of inter-metal dielectric layers. This is achieved, in part, by providing a dielectric layer formed from a low-k dielectric material. As used herein, the term low-k dielectric means a dielectric having a dielectric constant of less than about 3.5, e.g., less than about 2.5.

Figure 1A:
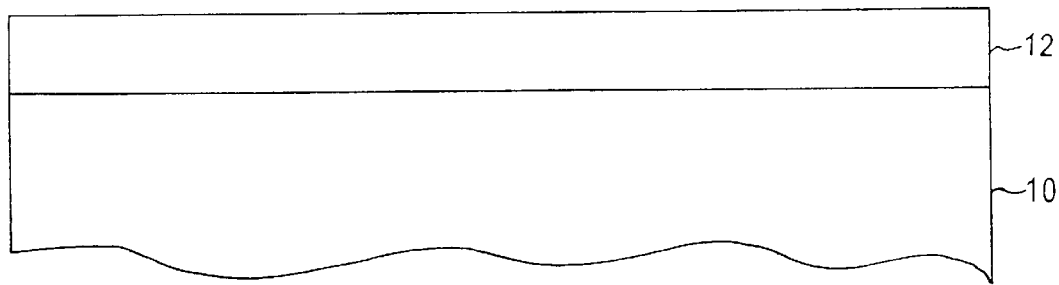
FIGS. 1A–1G schematically illustrate sequential phases of a conventional single damascene process.
Figure 1B:
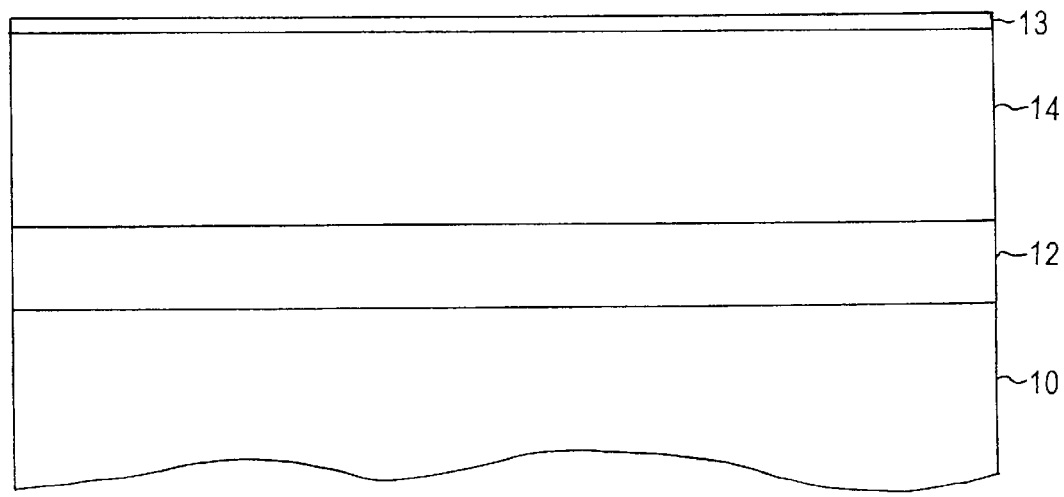
Figure 1C:
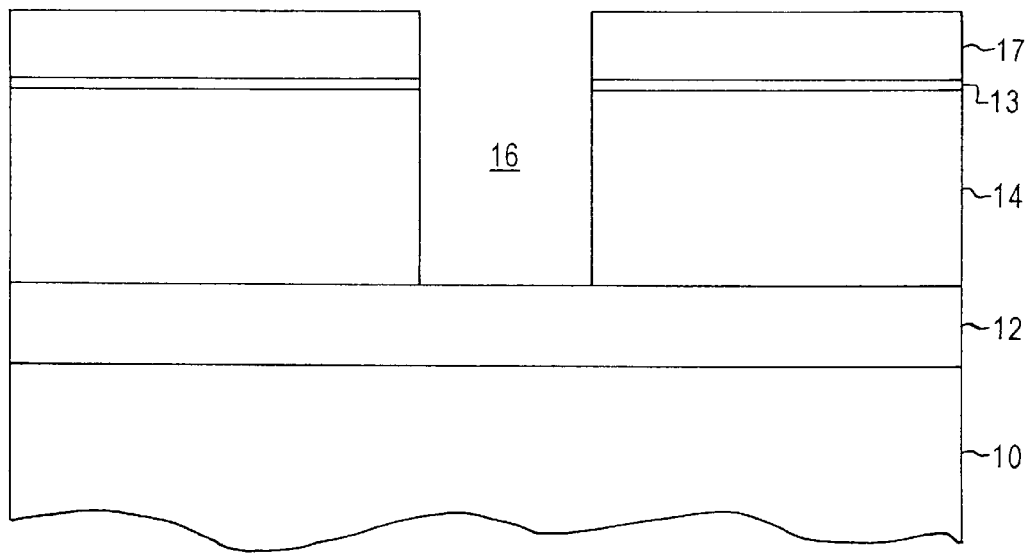
Figure 1D:
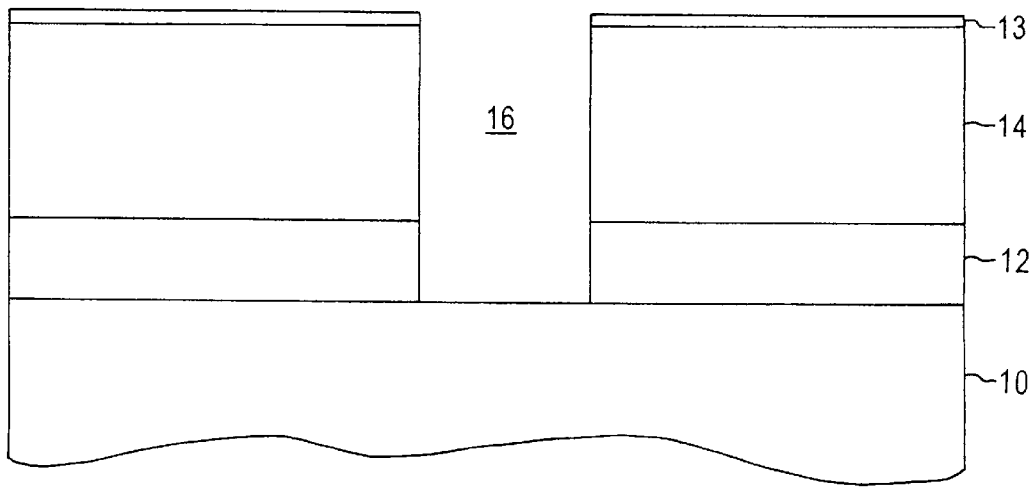
Figure 1E:
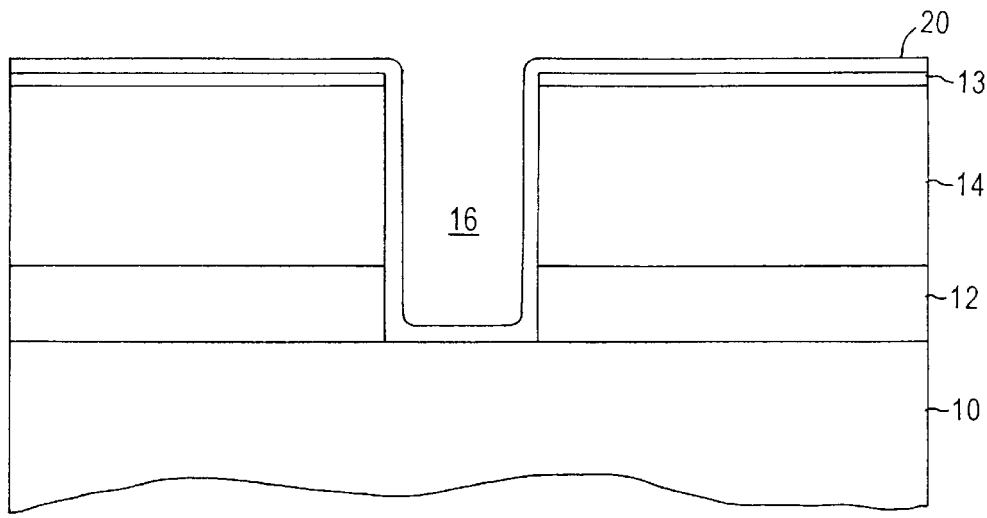
Figure 1F:
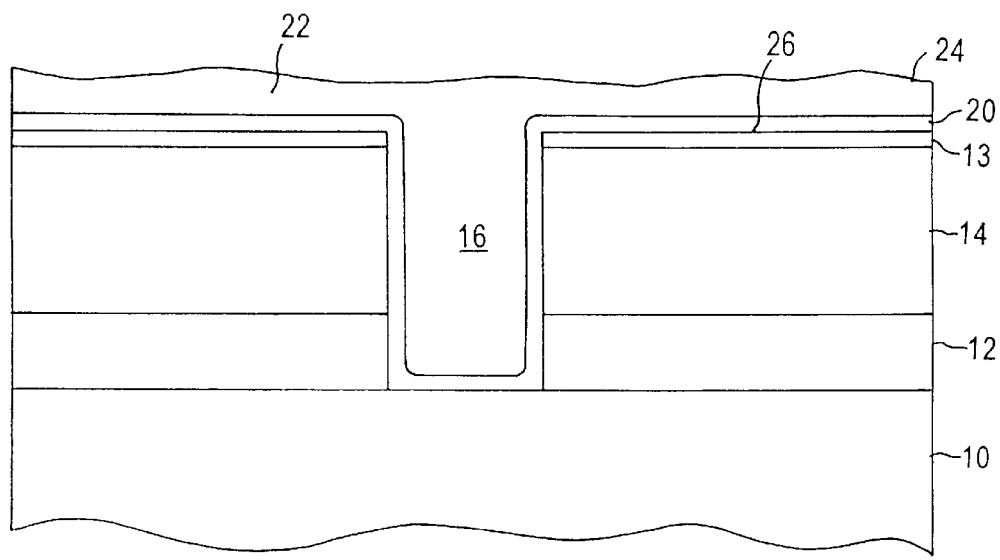
Figure 1G:
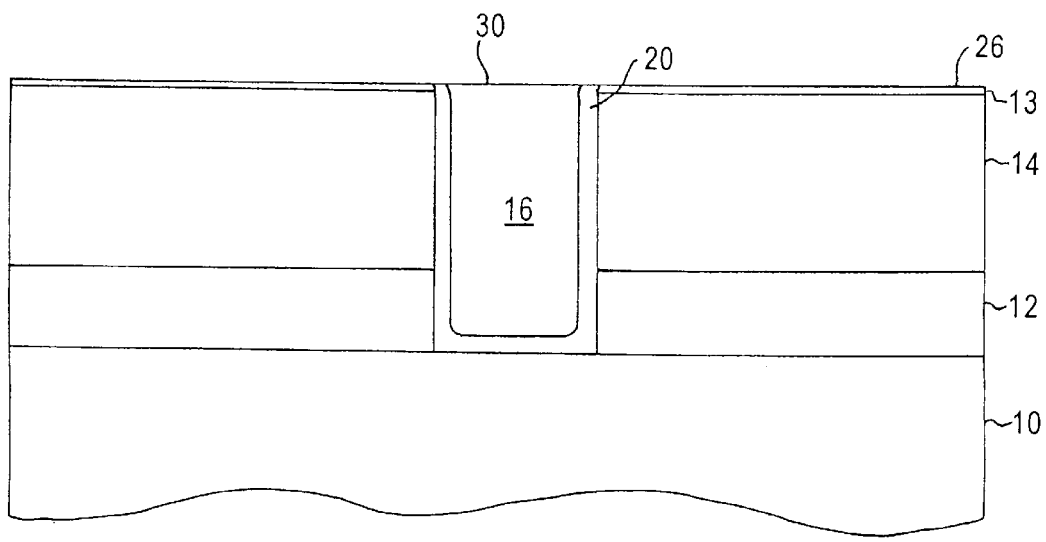
Figure 2A:
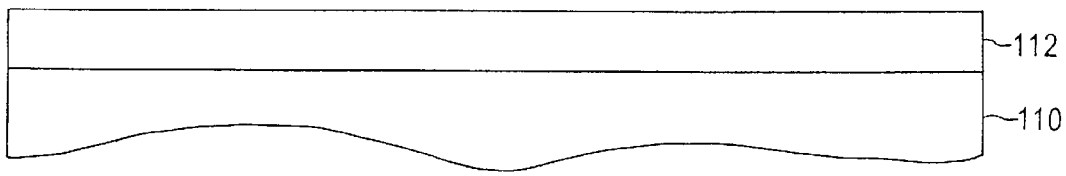
FIGS. 2A–2H schematically illustrate sequential phases of a single damascene process according to an embodiment of the present invention.

An embodiment of the present invention is illustrated in FIGS. 2A–2H. As illustrated in FIG. 2A, a first barrier layer 112 is deposited over a first level 110. The first level 110, however, is not limited as to a particular type of level. For example, the first level 110 can be a semiconductor surface, and a subsequently formed dielectric layer formed over the first level 110 can be termed an interlevel dielectric. The first level 110 can also be a metal layer substrate, such as a line or via, and the subsequently formed dielectric layer could therefore be termed an intermetal dielectric. The present disclosure is applicable to either type of first level 110. In one aspect of the invention, the first level 110 is a metal layer substrate; and as such, the first level 110 is therefore hereinafter referred to as a first metallization level 110.

The first barrier layer 112 can be formed from any material that prevents diffusion of the material from the metallization level 110 into a subsequently formed dielectric layer. For example, in a current aspect of the invention, the first metallization level 110 is formed from a Cu or Cu-based alloy. As such, the preferred first barrier layer 112 for use with Cu or Cu-based alloys acts as a diffusion barrier to Cu. The first barrier layer 112 can also act as a passivation layer that protects the first metallization level 110 from oxidation and contamination.

The thickness of the first barrier layer 112 depends upon factors such as the depth of a subsequently formed via in the dielectric layer over the first barrier layer 112. As such, the thickness of the first barrier layer 112 is preferably sufficient to act as an etch stop and not allow the etchant of the first barrier layer to reach the first metallization level 110. In current embodiments of the invention, the thickness of the first barrier layer 112 is at least 50 angstroms and is preferably from about 80 to about 120 angstroms.

In an aspect of the invention, the first barrier layer 112 is formed from silicon nitride although the invention is not limited in this manner. Silicon nitride advantageously acts as a diffusion barrier to copper and also as a passivation layer. Furthermore, silicon nitride acts as an etch stop to an etchant that etches low-k dielectric material. Any process capable of depositing the first barrier layer 112 is acceptable for use with the invention, and an illustrative process for depositing silicon nitride is PECVD.

Figure 2B:
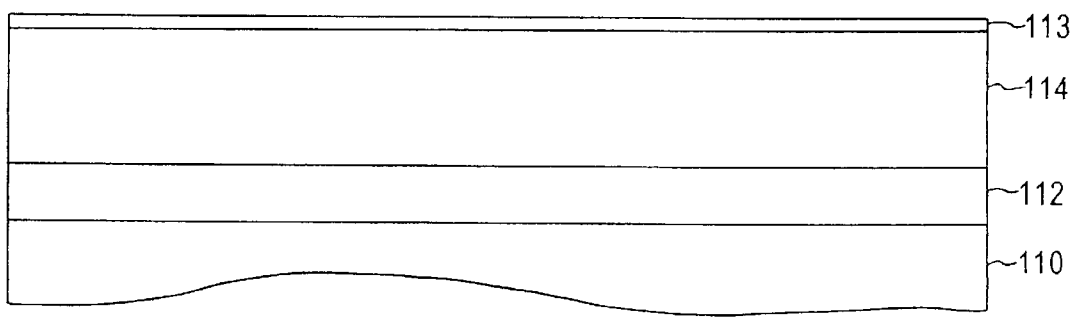

In FIG. 2B, a first dielectric layer 114 is deposited over the first barrier layer 112. The first dielectric layer 114 can be formed from any material capable of acting as a dielectric, and illustrative materials include silicon oxide and silicon nitride. In one aspect of the invention, the first dielectric layer 114 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the first dielectric layer 114 is formed from a porous low-k dielectric material, such as siloxanes, silsesquioxanes, aerogels, and xerogels.

These low-k dielectric materials can be applied via conventional spin-coating, dip coating, spraying, meniscus coating methods, in addition to other coating methods that are well-known in the art.

After formation of the first dielectric layer 114, a capping layer 113 can be formed over the first dielectric layer 114. The function of the capping layer 113 is to protect the first dielectric layer 114 from the process that removes a subsequently formed resist layer, and any material so capable is acceptable for use with the invention. The capping layer 113 can also be used as a mechanical polishing stop to prevent damage to the first dielectric layer 114 during subsequent polishing away of conductive material that is deposited over the first dielectric layer 114 and in a subsequently formed via. Examples of materials used as a capping layer 113 include silicon oxide and silicon nitride. In an aspect of the invention, the capping layer 113 is formed from silicon oxide and has a thickness of at least 50 angstroms. In another aspect of the invention, the thickness of the capping layer 113 is from about 400 to about 600 angstroms.

Figure 2C:
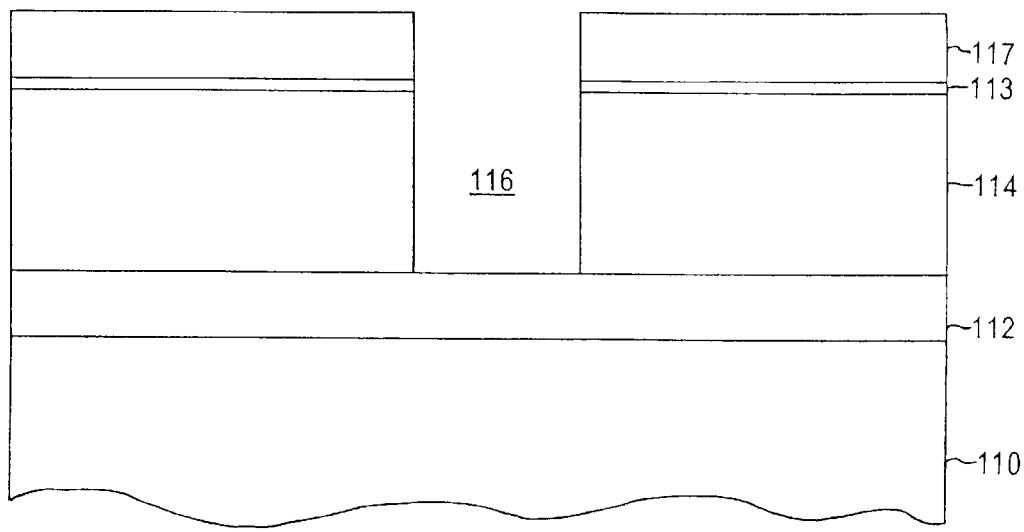

In FIG. 2C, vias 116 are formed in the first dielectric layer 114 and the capping layer 113 using conventional lithographic techniques, for example, optical lithography (including, for example, I-line and deep-UV), X-ray, and E-beam lithography, followed by etching. The lithographic process involves depositing a resist 117 over the capping layer 113 and exposing and developing the resist 117 to form the desired pattern of the vias 116.

The first etch, which is highly selective to the material of the first dielectric layer 114 and the capping layer 113, removes the capping layer 113 and the first dielectric layer 114 until the etchant reaches the first barrier layer 112. The first etch is typically an anisotropic etch, such as a reactive ion plasma dry etch, that removes only the exposed portions of the capping layer 113 and the first dielectric layer 114 directly below the opening in the resist 117. By using an anisotropic etch, the via 116 can be formed with substantially perpendicular sidewalls.

Figure 2D:
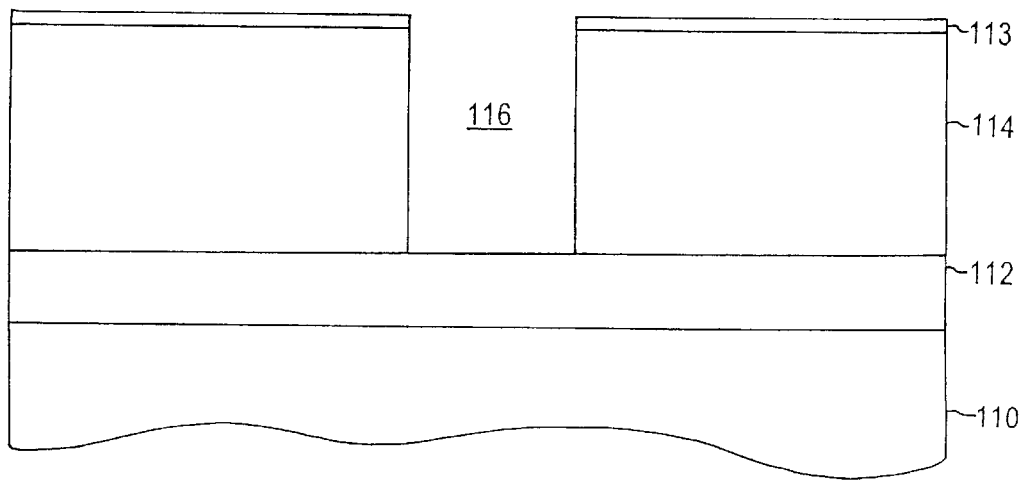

In a current aspect of the invention, as shown in FIG. 2D, the resist 117 is removed after the first etch. It should be noted, however, that the invention is not limited in this manner and the resist 117 can be removed, as is known in the art, after subsequent processing, for example, after the first barrier layer 112 is etched. Although any process capable of removing the resist 117 is acceptable for use with this invention, in a current aspect of the invention, the resist 117 is removed by oxidation using an 02 plasma at elevated temperatures, otherwise known as "ashing." In a current aspect of the invention, the process parameters used for ashing are a pressure of 1.2 Torr, RF power of 900 Watts, $O_2$ flow of 600 sccm, temperature of 40° C., and a time of 90 seconds.

The following chart provides illustrative ranges and preferred ranges for removal of the resist 117.

| Parameter | Range | Preferred Range |
| --- | --- | --- |
| Pressure (Torr) | 0.01–5.0 | 0.1–2.0 |
| RF power (Watts) | 50–3000 | 300–1500 |
| $O_2$ flow (sccm) | 20–2000 | 100–1100 |
| Temperature (° C.) | −40–350 | 25–100 |
| Time (seconds) | 20–300 | 45–180 |

Figure 2E:
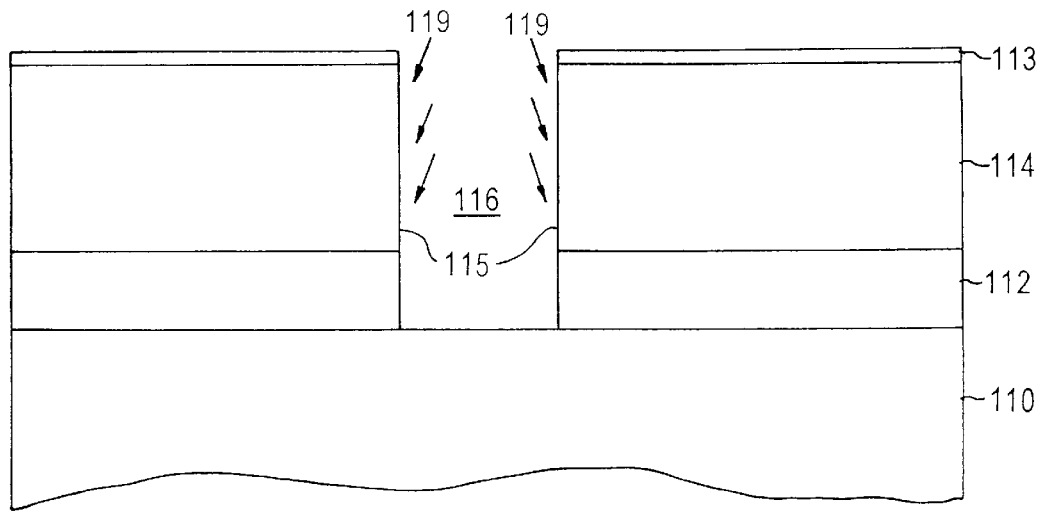

In FIG. 2E, after the resist 117 is removed, a second etch, which is highly selective to the material of the first barrier layer 112, then removes the first barrier layer 112 until the etchant reaches the first metallization layer 110. The second etch is also typically an anisotropic etch.

After the etching of the first dielectric layer 114 or after the removal of the resist 117, the first dielectric layer 114 is doped with a species 119 (indicated by arrows in the Figure) to replace the hydroxyl terminated ions formed on the side surfaces 115 of the via 116 with ions from the particular species being implanted. In so doing, the first dielectric layer 114 becomes increasingly hydrophilic; and therefore, the doped side surfaces 115 of the via 116 are less likely to absorb moisture from subsequent processing and cause the dielectric constant of the first dielectric layer 114 to increase as a result.

The invention is not limited as to the particular method of doping the first dielectric layer 114 with the species 119. For example, the first dielectric layer 114 can be doped using a plasma etch process or an ion implantation process. In a current aspect of the invention, the doping is performed via plasma treatment, and an illustrative tool capable of performing this process is a TEL DRM plasma etcher. Additionally, the invention is not limited as to the particular species 119 used for implanting so long as the implanted ion replaces the hydroxyl terminated ion and increases the hydrophilic properties of the side surface 115. In a current aspect of the invention, however, the implanted species 119 include methyl-related species, such as $CH_3OH$, $C_2H_5OH$, $CH_4$, and $C_2H_6$. These species respectively form $OCH_3$, $OC_2H_5$, $OCH_3$, and $OCH_2CH_3$ ions, which replace the hydroxyl terminated ion.

Figure 2F:
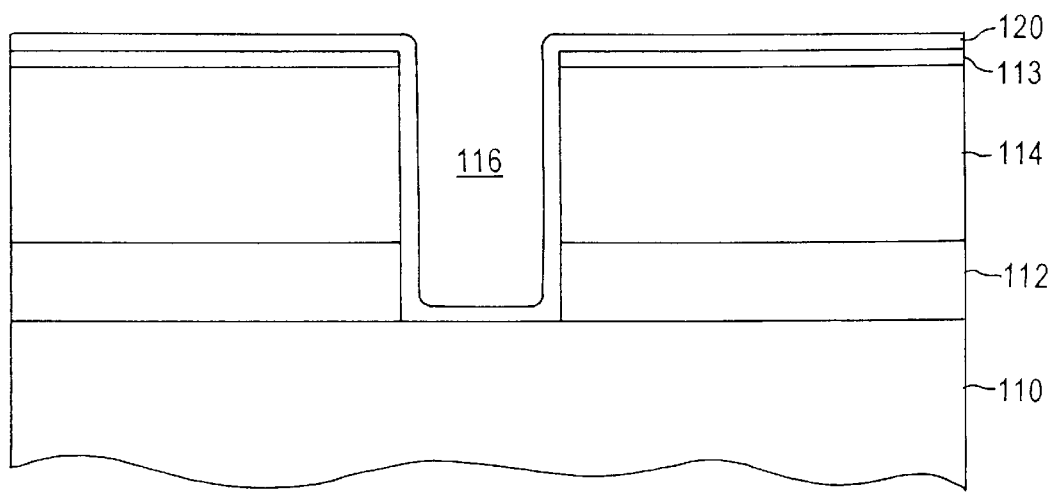

In FIG. 2F, an adhesion and barrier material, such as tantalum, titanium, tungsten, tantalum nitride, or titanium nitride, is deposited in the via 116. The combination of the adhesion and barrier material is collectively referred to as a second barrier layer 120. The second barrier layer 120 acts to prevent diffusion into the first dielectric layer 114 of the conductive material subsequently deposited into the via 116.

Figure 2G:
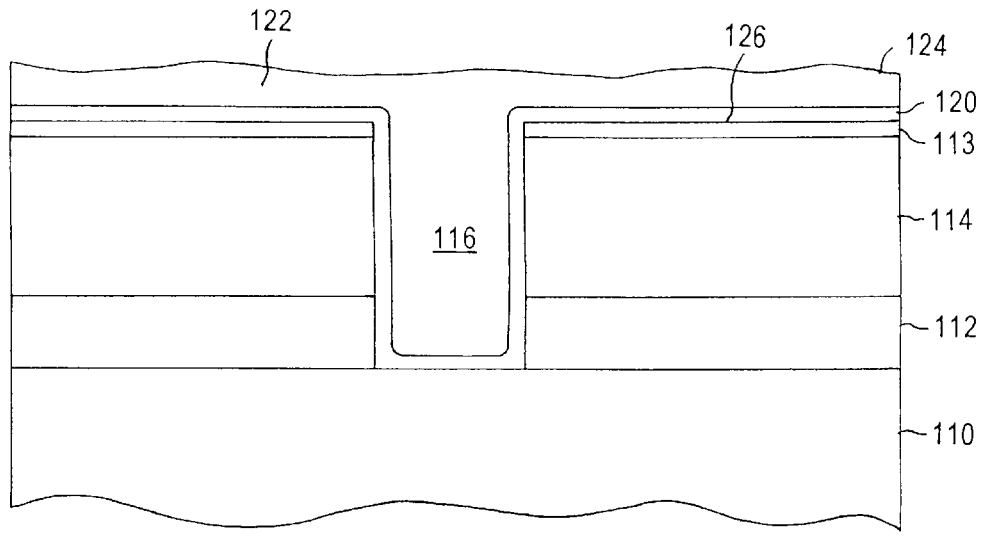

In FIG. 2G, a layer 122 of a conductive material is deposited into the via 116. In an aspect of the invention, the conductive material is a Cu or Cu-based alloy, and any process capable of depositing Cu into the via 116 is acceptable for use with this invention. An illustrative example of a process acceptable for use with this invention involves depositing a "seed" layer on the second barrier layer 120. After the seed layer has been formed, conventional plating techniques, e.g., electroless or electroplating techniques, are used to fill the via 116. So as to ensure complete filling of the via 116, the Cu-containing conductive layer 122 is deposited as a blanket (or "overburden") layer 124 so as to overfill the via 116 and cover the upper surface 126 of the capping layer 113.

Figure 2H:
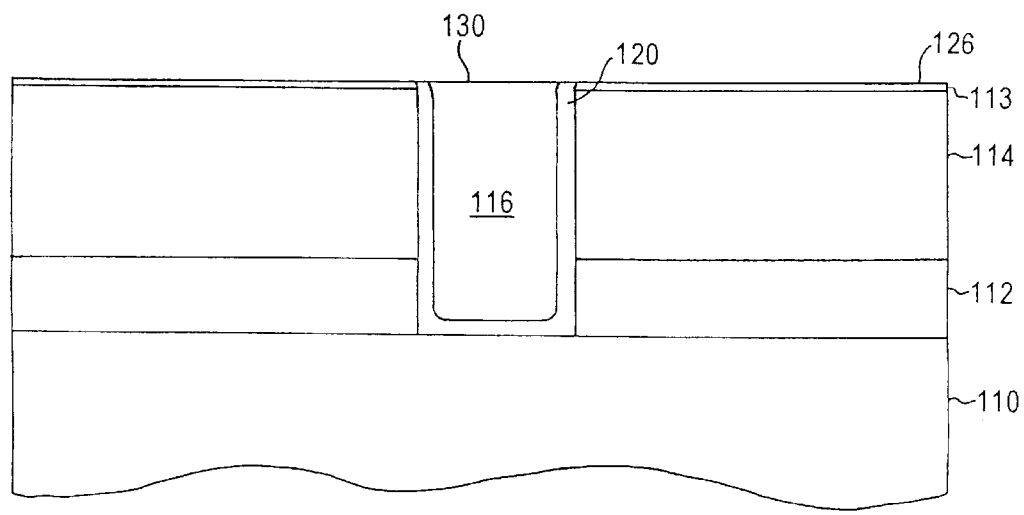

In FIG. 2H, the entire excess thickness of the metal overburden layer 124 over the upper surface 126 of the capping layer 113 is removed using a CMP process. A typical CMP process utilizes an alumina ($Al_2O_3$)-based slurry and leaves a conductive plug in the via 116. The conductive plug has an exposed upper surface 130, which is preferably substantially co-planar with the surface 126 of the capping layer 113.

By doping damaged surfaces of the dielectric layer to replace hydroxyl terminated bonds with another species, the exposed surfaces of the low-k dielectric material will become less hygroscopic. The low-k dielectric material will therefore absorb less moisture from subsequent processing, and the undesirable increase in dielectric constant of the low-k dielectric material typically associated with these subsequent processes can be reduced.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:

forming a first level;

forming a first barrier layer over the first level;

forming a dielectric layer over the first barrier layer;

forming an opening having side surfaces through the dielectric layer;

etching the first barrier layer to expose the first level;

replacing hydroxyl terminated ions on the side surfaces using plasma etching; and filling the opening with metal to form a first feature, wherein the plasma etching is performed using a species selected from the group consisting of $CH_3OH$, $C_2H_5OH$, $CH_4$, and $C_2H_6$.

2. The method of manufacturing a semiconductor device according to claim 1, wherein the step of replacing the hydroxyl terminated ions occurs before the first barrier layer is etched.

3. The method of manufacturing a semiconductor device according to claim 1, wherein the step of replacing the hydroxyl terminated ions occurs after the first barrier layer is etched.

4. The method of manufacturing a semiconductor device according to claim 1, wherein the dielectric layer has a dielectric constant less than about 3.5.

5. The method of manufacturing a semiconductor device according to claim 4, wherein the metal and the first level comprise copper (Cu) or a Cu alloy.

6. A method of manufacturing a semiconductor device, comprising the steps of:

forming a first level;

forming a first barrier layer over the first level;

forming a dielectric layer over the first barrier layer;

forming an opening having side surfaces through the dielectric layer;

etching the first barrier layer to expose the first level;

replacing hydroxyl terminated ions on the side surfaces; and filling the opening with metal to form a first feature, wherein the hydroxyl terminated ions are replaced by ions selected from the group consisting of $OCH_3$, $OC_2H_5$, $OCH_3$, and $OCH_2CH_3$.

7. A method of treating a dielectric layer, comprising the steps of:

etching a feature into a dielectric layer, the feature having side surfaces; and treating the feature surfaces to replace hydroxyl terminated ions on the side surfaces with a species that reduces hygroscopy of the feature side surfaces using plasma etching, wherein the plasma etching is performed using a species selected from the group consisting of $CH_3OH$, $C_2H_5OH$, $CH_4$, and $C_2H_6$.

8. The method of treating a dielectric layer according to claim 7, wherein the hydroxyl terminated ions are replaced by ions selected from the group consisting of $OCH_3$, $OC_2H_5$, $OCH_3$, and $OCH_2CH_3$.

9. The method of treating a dielectric layer according to claim 7, further comprising the step of filling an opening with metal, the opening formed by etching the feature.

10. The method of treating a dielectric layer according to claim 7, wherein the metal comprises copper (Cu) or a Cu alloy.

* * * * *